Oct. 13, 1953 L. B. VALDES 2,655,608

SEMICONDUCTOR CIRCUIT CONTROLLING DEVICE

Filed July 22, 1952

INVENTOR
L. B. VALDES
BY [signature]
ATTORNEY

Patented Oct. 13, 1953

2,655,608

UNITED STATES PATENT OFFICE 2,655,608

SEMICONDUCTOR CIRCUIT CONTROLLING DEVICE

Leopoldo B. Valdes, New Providence, N. J., assignor to Bell Telephone Laboratories, Incorporated, New York, N. Y., a corporation of New York Application July 22, 1952, Serial No. 300,181

7 Claims. (Cl. 307—88)

This invention relates to circuit controlling elements and more particularly to such elements including semiconductor signal translating devices of the type now known as transistors.

In a variety of electrical circuits, for example in telephone switching systems, there is need for a control element which can be actuated readily and efficiently to change a path in the circuit or system from a high impedance to a low impedance condition and which, further, will be bidirectional in transmission properties and introduce no appreciable transmission loss.

Transistors, such as those disclosed in Patent 2,524,035, granted October 3, 1950, to J. Bardeen and W. H. Brattain and Patent 2,569,347, granted September 25, 1951, to W. Shockley, can be triggered from a high impedance to a low impedance state. This may be effected, for example, by varying the bias, which is in the reverse direction, upon the collector. Up to a certain collector voltage, the collector current is small, increasing very little with the voltage. However, when the peak voltage is reached and passed, the device is triggered to a state providing a high current at low voltage.

The peak voltage in known devices is dependent upon a number of parameters, including the emitter and collector currents, the feedback resistance and the current multiplication factor, which vary with other factors. Consequently, for known devices, the peak voltage is difficult to control accurately.

One general object of this invention is to improve circuit controlling elements. More specifically, objects of this invention are to improve such elements including semiconductor devices and to enable accurate determination of the triggering voltage in transistor switching devices.

In accordance with one feature of this invention, in a switching element, a semiconductor diode having a preassigned Zener voltage, below the breakdown or peak voltage of the collector, is associated with the transistor to control the triggering voltage. Such diodes, commonly referred to a Zener diodes, are disclosed in detail in the application Serial No. 211,212, filed February 16, 1951, of W. Shockley. The diode is poled in the reverse direction for biases of the normal, reverse, polarity on the collector. The emitter of the transistor is tied to the base through an appropriate resistor. In one specific embodiment, the diode is connected directly between the collector and base.

At zero or low collector biases, the collector current is negligible and the current through the base-emitter resistor likewise is small so that the emitter bias is substantially zero. The collector impedance is very high. When, however, the collector bias reaches the Zener voltage of the diode, a large current flows through the resistor mentioned whereby the emitter is biased in the forward direction and the transistor is triggered to the high current, low impedance state. Thus, upon application of an appropriate voltage to the collector, the impedance between base and collector terminals is changed abruptly from a high value to a low value, and, hence, the transistor-diode combination constitutes a switching element providing negligible loss and bidirectional transmission.

In accordance with another feature of this invention, the Zener diode is constructed as an integral part of a junction type transistor.

The invention and the above noted and other features thereof will be understood more clearly and fully from the following detailed description with reference to the accompanying drawing in which.

Figure 4:
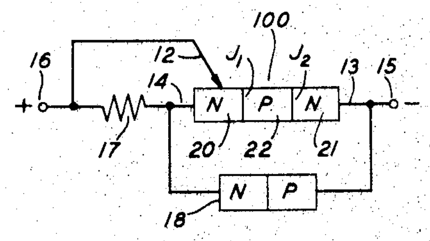
Figure 5:
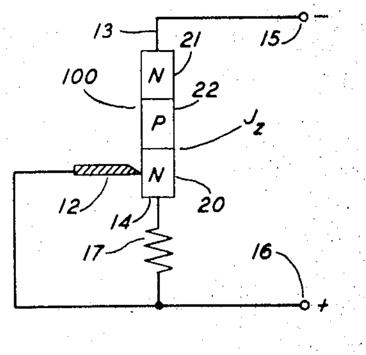

Fig. 4 portrays another embodiment of this invention wherein the transistor is of the point emitter-junction collector type; and Fig. 5 illustrates another embodiment of this invention wherein the Zener diode constitutes a part of the transistor structure.

Referring now to the drawing, the circuit controlling element illustrated in Fig. 1 comprises a point contact transistor 10, such as disclosed in the Bardeen et al. patent identified hereinabove. The transistor includes a semiconductive wafer 11, for example of germanium or silicon, and emitter, base and collector connections 12, 13 and 14 respectively to the body 11. The collector and emitter are connected to terminals 15 and 16 respectively, a resistor 17 being provided common to the emitter-base and collector-base circuits as shown. Connected directly between the collector and base is a Zener diode 18.

In operation of the transistor, as disclosed for example in the patent to Bardeen et al. above mentioned, the collector 13 is biased in the reverse direction relative to the base 14. Specifically, if the body 11 is of N conductivity type, the collector 13 is biased negative; if the body 11 is of P conductivity type, the collector 13 is biased positive. The emitter is biased in the forward direction by virtue of the drop appearing across the resistor 17 due to the reverse collector current.

Figure 1:
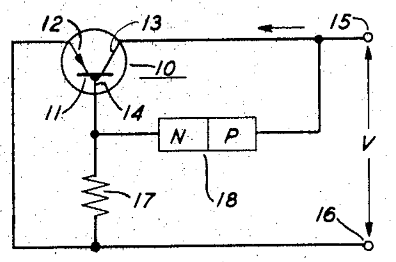
Fig. 1 is a diagram depicting one embodiment of this invention wherein the transistor is of the point contact type.
Figure 2:
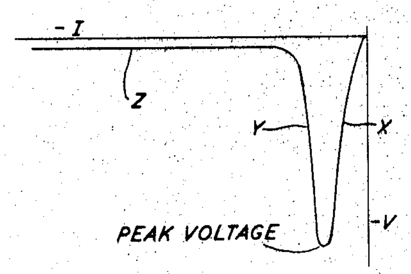
Figs. 2 and 3 are graphs of typical voltage-current characteristics of transistor collectors and Zener diodes respectively.

The collector current-voltage characteristic for the device of Fig. 1 with the diode 18 omitted is depicted in Fig. 2. As is evident therefrom, as the reverse collector bias (V) is increased from zero, the collector current (I) is small and the impedance between the terminals 15, 16 is high, over a range of voltages corresponding to the portion X of the plot. When, however, the voltage reaches the value indicated by the peak voltage point on the curve, the device triggers, passing through a negative resistance state represented by portion Y of the curve and to a high current condition represented by portion Z of the curve. For the high current state or condition, the impedance between the terminals 15 and 16 is positive and low. The transfer from the low current to the high current condition is attributable in part to the increasing drop across the resistor 17 with consequent increase in the forward bias on the emitter 12. For small values of current, say in the range X, this drop is small; for the high current state, part Z of the characteristic, this drop is relatively large so that the forward bias on the emitter is substantial.

It will be appreciated, then, that the transistor is utilizable as a circuit controlling element, for example as a crosspoint switch in telephone switching systems. For voltages between zero and the peak value, the impedance between terminals 15 and 16 is high and the device is in, or essentially in, an open circuit condition. When a voltage of the magnitude of the peak voltage is applied between the terminals 15 and 16 the device triggers to the high current or closed circuit condition. The impedance between terminals 15 and 16 is low. Further, the device is bidirectional in transmission properties when it has been transferred to the state or condition Z.

As has been noted hereinabove, the peak voltage is dependent upon a number of factors, and the relations between these factors. The relationships are not amenable to precise control so that difficulty has been encountered heretofore in providing devices which will trigger at a prescribed peak voltage. These difficulties are overcome in accordance with a feature of this invention.

Figure 3:
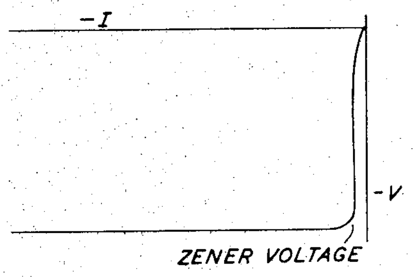

The reverse current voltage characteristic of a Zener diode is portrayed in Fig. 3. As there shown, as the reverse voltage is increased from zero, the current increases very slowly until the Zener voltage is reached. At this point, the diode in effect breaks down and the current increases very rapidly becoming substantially independent of voltage.

In Fig. 1, the diode 18 is poled so that it is operated in the reverse direction for the normal polarity of collector bias. For low values of voltage between the terminals 15 and 16, as is evident from Figs. 2 and 3, the current through the resistor 17 is small and the transistor 10 is in the low current or open circuit condition. However, when the applied voltage reaches the Zener point of the diode, the current through resistor 17 increases abruptly thereby similarly increasing the forward bias on the emitter 12 and triggering the transistor to the high current or closed circuit condition. The Zener point, then, determines the triggering voltage for the transistor. The Zener voltage can be determined precisely by design of the diode in accordance with known procedures. Thus, a switch or circuit control as illustrated in Fig. 2 can be provided to trigger precisely at a prescribed voltage applied between the terminals 15 and 16, thereby to transfer a path between these terminals from open circuit to closed circuit state.

The invention may be embodied also in circuit controlling elements including junction type transistors such as shown in the patent to Shockley identified heretofore. One such embodiment is represented in Fig. 4. The transistor 100 comprises a semi-conductive body, for example of germanium or silicon, having therein a pair of N conductivity type zones 20 and 21 on opposite sides of and contiguous with a P-type zone 22 and defining a pair of PN junctions $J_1$ and $J_2$ therewith. Advantageously, the body is of single crystal structure fabricated, for example, in the manner disclosed in the application Serial No. 168,184, filed June 15, 1950 of G. K. Teal. A point contact emitter 12 bears against the N zone 20 and is connected to the base 14 through the resistor 17. The Zener diode 18 is connected between the base 14 and collector 13 as shown.

For voltages between the terminals 15 and 16 of the polarity indicated in the figure, it will be noted that the junction $J_2$ is biased in the forward direction whereas both the junction $J_1$ and the Zener diode 18 are biased in the reverse direction. The current voltage characteristic of the device, viewed between the terminals 15 and 16, is of the form represented in Fig. 2. Thus, for voltages between these terminals below the Zener point of the diode 18, the device is in the low current or open circuit condition. The drop across resistor 17 is small and the bias on the emitter 12 likewise is small. However, when this voltage is of the Zener value, the diode 18 breaks down whereby the drop across resistor 17 increases abruptly and the emitter is biased at a substantial potential in the forward direction. Hence, the device is triggered to the high current, closed circuit condition.

It will be appreciated that in both the devices illustrated in Figs. 1 and 4, when triggered to the high current condition, the transistors provide negligible loss so that switching is effected efficiently.

The embodiment of this invention illustrated in Fig. 5 is similar to that portrayed in Fig. 4 and described hereinabove. However, the junction $J_2$ in the semiconductive body is fabricated to have a prescribed relatively low Zener voltage. Thus zones 20 and 22 constitute a Zener diode which functions in the same manner as the diode 18 in the switch illustrated in Fig. 4.

In all the embodiments shown and described, once the device has been triggered to the high current state, it will remain locked in that state until the voltage between the terminals 15 and 16 is reduced to substantially zero.

Although several specific embodiments of this invention have been shown and described, it will be understood that they are but illustrative and that various modifications may be made therein without departing from the scope and spirit of this invention. For example, although in the specific embodiments illustrated in Figs. 4 and 5, the transistors include point type emitters, transistors utilizing junction type emitters also may be employed.

Reference is made of the applications Serial No. 300,220 filed July 22, 1952 of W. Shockley and Serial No. 300,335 filed July 22, 1952 of J. J.

Ebers wherein related inventions are disclosed and claimed.

What is claimed is:

1. A signal translating device comprising a transistor having a base, emitter and collector, a resistor connected between said emitter and said base, a diode having a prescribed break-down voltage connected between said collector and base, and a pair of terminals one connected to said collector and the other to the emitter side of said resistor, said diode and resistor being in series relation between said terminals.

2. A signal translating device comprising a transistor having a base, emitter and collector, a resistor connected between said emitter and said base, and a series circuit between said collector and said base including said resistor and means defining a Zener diode connected between said base and collector and poled in the reverse direction for the normal polarity of bias on said collector.

3. A circuit controlling device comprising a pair of terminals, a transistor having a base, emitter and collector, said collector being connected to one of said terminals, a resistor connected between said emitter and base, a connection from the other of said terminals to a point between said emitter and resistor, and a semiconductor diode connected between said collector and base and having a preassigned Zener voltage, said diode being poled in the reverse direction for the normal polarity of bias on said collector.

4. A circuit controlling device comprising a transistor having a base and point contact emitter and collector, a resistor connected between said base and said emitter, and a semiconductor diode connected between said base and said collector and having a preassigned Zener voltage, said diode being poled in the reverse direction for the normal collector bias polarity.

5. A circuit controlling device comprising a transistor including a semiconductive body having therein a zone of one conductivity type between and forming junctions with a pair of zones of the opposite conductivity type, base and collector connections to said pair of zones respectively, an emitter connection to the zone having the base connection thereto and connected to said base connection through a resistor, and a diode connected between said base and collector connections and having a preassigned breakdown voltage.

6. A circuit controlling device in accordance with claim 5 wherein said one zone is of P-type and said diode comprises a PN junction having a preassigned Zener voltage, the P zone of said junction being connected to said collector connection and the N zone of said junction being connected to said base connection.

7. A circuit controlling device comprising a pair of terminals, a transistor including a semiconductive body having a pair of outer zones of one conductivity type and an intermediate zone of the opposite conductivity type defining a pair of junctions with said outer zones, each of said outer zones being connected to a respective one of said terminals, one of said junctions having a prescribed Zener voltage, an emitter connection to the end zone defining said one junction with said intermediate zone, and a resistor connected between said emitter connection and said last mentioned end zone, said resistor being between said last mentioned zone and the terminal connected thereto.

LEOPOLDO B. VALDES.

References Cited in the file of this patent

UNITED STATES PATENTS

| Number | Name | Date |
|---|---|---|
| 2,579,336 | Rack | Dec. 18, 1951 |
| 2,594,336 | Mohr | Apr. 29, 1952 |